United States Patent
Kwon (10) Patent No.: US 7,166,502 B1
(45) Date of Patent: Jan. 23, 2007

(54) METHOD OF MANUFACTURING A THIN FILM TRANSISTOR

(75) Inventor: Oh-Nam Kwon, Uiwang-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/709,483

(22) Filed: Nov. 13, 2000

(30) Foreign Application Priority Data

Nov. 10, 1999 (KR) ............................... 1999-49777

(51) Int. Cl.
*H01L 21/00* (2006.01)
*H01L 21/4763* (2006.01)

(52) U.S. Cl. ...................... 438/158; 438/589; 438/678; 438/687; 438/675; 438/677; 438/FOR. 200; 438/FOR. 363

(58) Field of Classification Search ................ 438/158, 438/589, 678, 687, 675, 677, FOR. 200, 438/FOR. 363
See application file for complete search history.

(56) References Cited

U.S. PATENT DOCUMENTS

| | | | | |
|---|---|---|---|---|
| 3,632,435 | A | * | 6/1969 | Eriksson ...................... 117/212 |
| 5,247,191 | A | * | 9/1993 | Yamazaki et al. ............. 257/72 |
| 5,364,459 | A | * | 11/1994 | Senda et al. ................. 106/122 |
| 5,660,706 | A | * | 8/1997 | Zhao et al. .................. 205/123 |
| 5,705,230 | A | * | 1/1998 | Matanabe et al. ........... 427/438 |
| 5,821,580 | A | * | 10/1998 | Kuwahara .................... 257/330 |
| 5,891,804 | A | * | 4/1999 | Havemann et al. ......... 438/674 |
| 6,284,652 | B1 | * | 9/2001 | Charneski et al. ........... 438/653 |
| 6,480,253 | B1 | * | 11/2002 | Shigeta et al. .............. 349/148 |

FOREIGN PATENT DOCUMENTS

| | | | | |
|---|---|---|---|---|
| JP | 63274706 | A | * | 11/1988 |
| JP | 01017803 | A | * | 1/1989 |
| JP | 02-271637 | | | 11/1990 |
| JP | 04-170519 | | | 6/1992 |
| JP | 05-107553 | | | 4/1993 |
| JP | 05-265040 | | | 10/1993 |
| JP | 06-097197 | | | 4/1994 |
| KR | 1999-014212 | | | 2/1999 |
| KR | 1999-015599 | | | 3/1999 |

OTHER PUBLICATIONS

Chan, Phase Transistion of Helium in aerogel, Czecyoslovak—Journal of Physic, vol. 46, pp. 2915-2922, 1996.*
Cecilia Y. Mak; MRS Bulletin; "Electorless Copper Deposition on Metals and Metal Silicides"; Aug. 1994; (pp. 55-61).

* cited by examiner

*Primary Examiner*—Matthew Smith
*Assistant Examiner*—Thanh Van Pham
(74) *Attorney, Agent, or Firm*—McKenna Long & Aldridge LLP (57) ABSTRACT

The present invention discloses a method of manufacturing a thin film transistor, including: preparing a substrate and a mixed solution, the mixed solution having a reductant and a first metal; forming a photoresist pattern on the substrate; etching a portion of the substrate to form a groove using the photoresist pattern as a mask; depositing a second metal on the substrate, a height of the second metal being smaller than a depth of the groove; removing the photoresist pattern on the substrate and the second metal on the photoresist other than in the groove; and forming the first metal on the second metal in the groove by submerging the substrate in the mixed solution.

13 Claims, 6 Drawing Sheets

(Related Art)

Fig 4

(Related Art)

METHOD OF MANUFACTURING A THIN FILM TRANSISTOR

This application claims the benefit of Korean Patent Application No. 1999-49777, filed on Nov. 10, 1999, which is hereby incorporated by reference.

BACKGROUND OF THE INVENTION

1. Field of the Invention

The present invention relates to a thin film transistor, and more particularly, to a method of manufacturing a thin film transistor for use in a liquid crystal display (LCD) device.

2. Discussion of the Related Art

Of known liquid crystal display devices, an active matrix liquid crystal display (AM-LCD) device, in which the thin film transistors and the pixel electrodes are arranged in the form of a matrix, has recently received a great deal of attention because of its high resolution and good performance for displaying the moving images.

Figure 1:
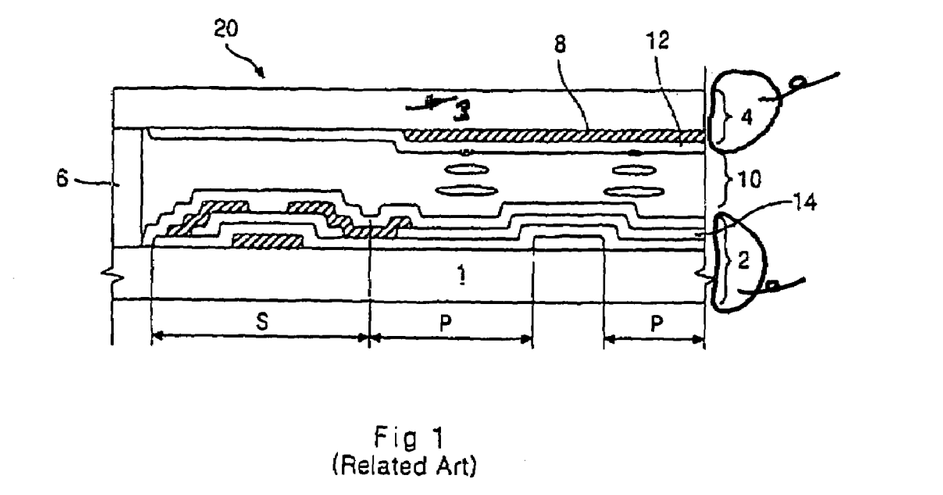
FIG. 1 is a cross sectional view illustrating a typical active matrix LCD device.

FIG. 1 is a cross sectional view illustrating a typical AM-LCD device. As shown in FIG. 1, the LCD device 20 includes lower and upper substrates 1 and 3, with a liquid crystal layer 10 interposed between the upper and lower substrates. The lower substrate 1 has a thin film transistor "S" (TFT) as a switching element and a pixel electrode 14. The upper substrate 3 has a color filter 8 and a common electrode 12. The pixel electrode 14 is formed over a pixel region "P" and serves to apply a voltage to the liquid crystal layer 10 along with the common electrode 12, and the color filter 8 serves to implement natural colors. A sealant 6 seals edges of the lower and upper substrates 1 and 3 to prevent a leakage of the liquid crystal.

A TFT for use in the LCD device is usually an inverted staggered-type TFT because its structure is simple and its performance is excellent. The inverted staggered-type TFT is divided into a back channel etch type TFT and an etch-stopper type TFT. The present invention is explained with a particular focus on the back channel etch type TFT, whose manufacturing process is relatively simple.

Figure 2A:
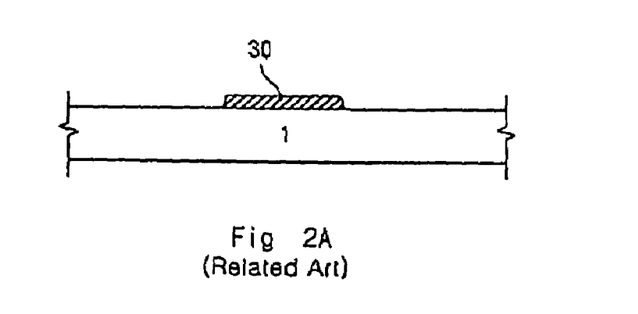
FIGS. 2A to 2E are cross sectional views illustrating a process for manufacturing a lower array substrate for use in a conventional LCD device.

FIGS. 2A to 2E are cross sectional views illustrating a process for manufacturing an array substrate for use in a conventional LCD device. First, as shown in FIG. 2A, a gate electrode 30 is formed on a substrate 1. The gate electrode 30 is made of a low resistive material such as aluminum in order to prevent a signal delay.

Figure 2B:
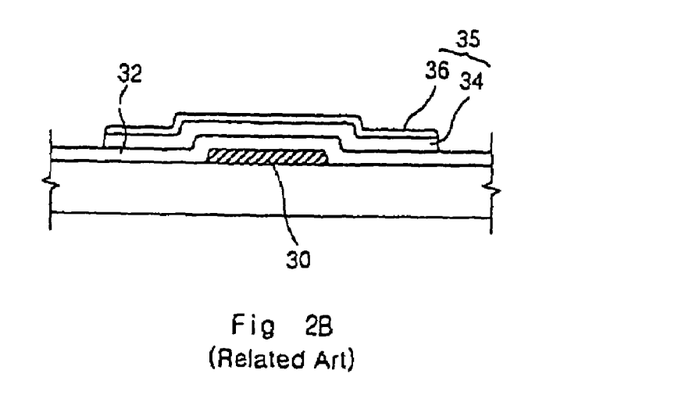

Then, as shown in FIG. 2B, a gate insulating layer 32, an amorphous silicon layer 34, and a doped amorphous silicon layer 36 are sequentially deposited over the whole substrate 1. The amorphous silicon layer 34 and the doped amorphous silicon layer 36 are patterned into an active layer 35. The gate insulating layer 32 includes SiNx or $SiO_2$ that can be deposited at the low temperature (for example, of less than 350° C.) and has a good insulation property.

The doped amorphous silicon layer 36 is formed by ion-doping gas containing one of the Group III or one of the Group V elements (for example, boron or phosphorous) after the amorphous silicon layer is deposited. For example, an n+ amorphous silicon layer (n+ a-Si:H) formed by ion-doping the phospine gas $PH_3$ containing the phosphorous (P) is usually used as the doped amorphous silicon layer 36.

Figure 2C:
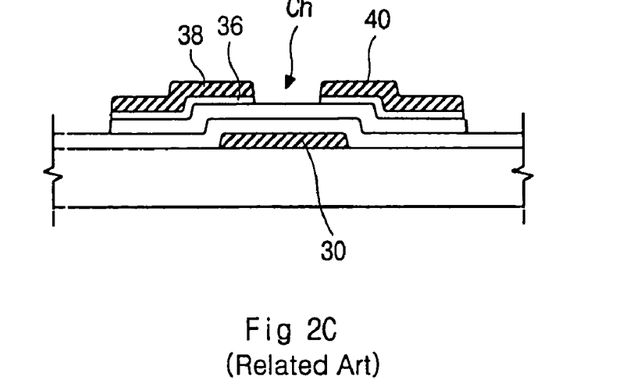

Subsequently, as shown in FIG. 2C, source and drain electrodes 38 and 40 are formed on the doped amorphous silicon layer 36. The source and drain electrodes 38 and 40 are spaced apart from each other and overlap both end portions of the gate electrode 30. Thereafter, using the source and drain electrodes 38 and 40 as a mask, a portion of the doped amorphous silicon layer 36 between the source and drain electrodes 38 and 40 is etched to form a channel region "Ch".

Figure 2D:
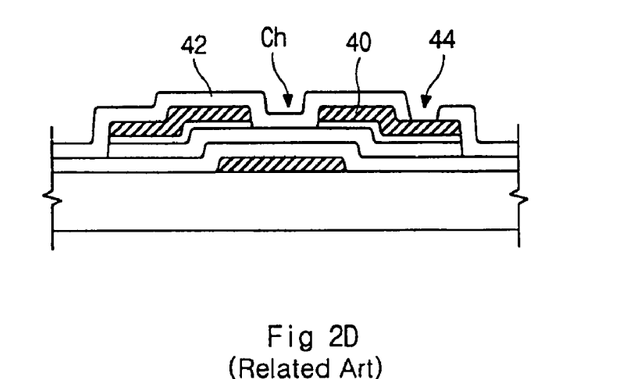

Next, as shown in FIG. 2D, a passivation layer 42 is formed over the whole substrate 1. The passivation layer 42 serves to protect the channel region "Ch" from humidity, external impact and the like, and is preferably made of an inorganic material such SiNx or an organic material such as benzocyclobutene (BCB). The passivation layer 42 includes a contact hole 44 on a portion of the drain electrode 40.

Figure 2E:
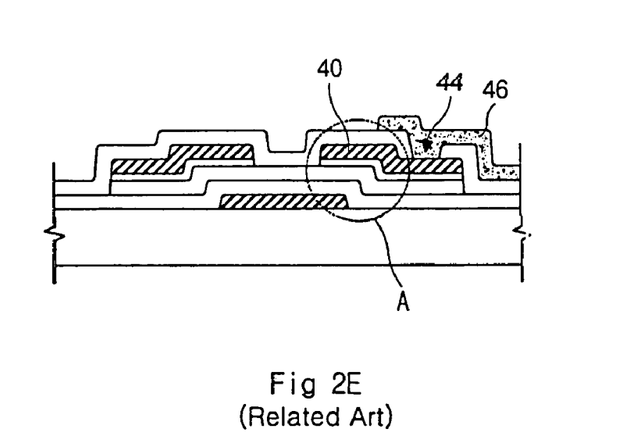

Finally, as shown in FIG. 2E, a pixel electrode 46 is formed on the passivation layer 42 and is electrically connected with the drain electrode 40 through the contact hole 44. Preferably, the pixel electrode 46 is made of indium tin oxide (ITO). Therefore, most of the important components are arranged on the array substrate.

The characteristics of the lower array substrate usually depend on materials used for the respective components. For example, in case of the large-sized liquid crystal display device of more than 18 inches having a high resolution such as SXGA and UXGA, the resistivity of the material used for the gate and data lines becomes the important parameter for determining the display quality. For example, a display distortion may occur because of cross-talk by the signal delay due to the line resistance of the gate electrode. Therefore, conventional LCD devices have employed aluminum or aluminum alloy for metal lines such as the gate and data lines. However, aluminum has poor corrosion resistance and may cause a line defect due to a hillock or bump that may be generated during subsequent high temperature process. Moreover, increasing thickness or width of the metal line in order to reduce the line resistance may lead to a decrease in aperture ratio and occurrence of step portion (coverage).

Figure 3:
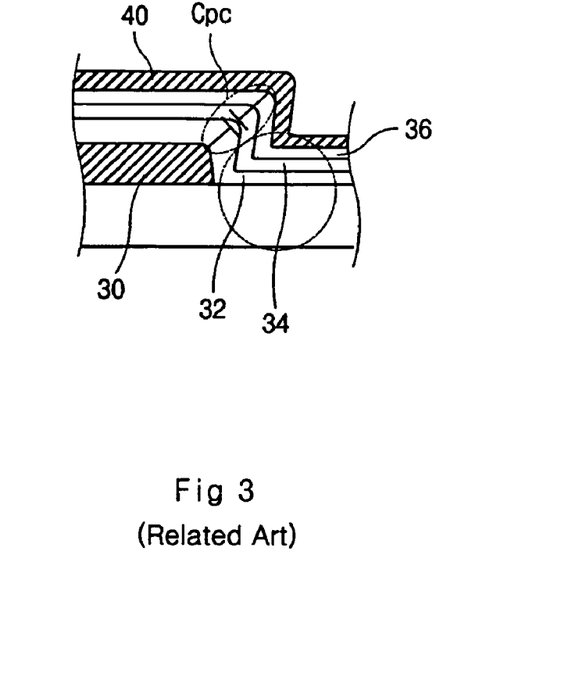
FIG. 3 is an enlarged view illustrating a portion A of FIG. 2E.

In other words, as shown in FIG. 3, when the gate electrode 30 is thickly formed to reduce its resistance, the gate insulating layer 32, the amorphous silicon layer 34, the doped amorphous silicon layer 36, and the drain electrode 40 may have a line open because the step difference becomes large and their step coverage is thus insufficient. Besides, because of the step difference of the gate electrode 30, a parasitic capacitance "Cpc" occurs between the gate electrode 30 and the drain electrode 40 and, therefore a flicker develops significantly, thereby causing display distortion.

For the foregoing reasons, there is a need for a thin film transistor having an improved display quality as well as a high aperture ratio.

SUMMARY OF THE INVENTION

Accordingly, the present invention is directed to a method of manufacturing a thin film transistor that substantially obviates one or more of the problems due to limitations and disadvantages of the related art.

An object of the present invention is to provide a method of manufacturing a thin film transistor having a high aperture ratio and excellent display quality.

To overcome the problems described above, preferred embodiments of the present invention provide a method of manufacturing a thin film transistor having an excellent display quality and a high aperture ratio.

In order to achieve the above object, the preferred embodiment of the present invention provides a method of manufacturing a thin film transistor, including: preparing a substrate and a mixed solution, the mixed solution containing a reductant and a first metal; forming a photoresist pattern on the substrate; etching a portion of the substrate to form a groove using the photoresist pattern as a mask; depositing a second metal on the substrate, a height of the second metal smaller than a depth of the groove; removing the photoresist pattern on the substrate and the second metal on the photoresist other than in the groove; and forming a first metal on the second metal in the groove by submerging the substrate having the first metal in the mixed solution.

The method further includes forming a first insulating layer on the substrate to cover the first metal; forming a semiconductor layer on the first insulating layer; forming source and drain electrodes on the semiconductor layer; forming a second insulating layer over the whole substrate covering the source and drain electrode, the second insulating layer including a contact hole on a portion of the drain electrode; and forming a pixel electrode on the second insulating layer, the pixel electrode electrically connecting with the drain electrode through the contact hole. And the first metal is a gate electrode.

When the first metal is a copper (Cu), the mixed solution contained a sulfuric acid ($H_2SO_4$), a cupric sulfate ($CuSO_4 \cdot 5H_2O$), and the reductant is one of a formaldehyde (HCHO), a hydrazine, a sodium phosphate ($NaH_2PO_2$), a sodium borate ($NaBH_4$), and a DMAB (dimethyl amine borane).

When the first metal is a silver (Ag), the mixed solution contains a silver nitrate ($AgNO_3$), an ammonium hydroxide ($NH_4OH$), and a sodium hydroxide (NaOH), and the reductant is one of a formaldehyde, a hydrazine and a glucose.

When the first metal is a gold (Au), the mixed solution contains a gold nitrate ($AuCl_2$), a sodium chloride (NaCl), and a water ($H_2O$), and the reductant is one of a formaldehyde, a glucose, a sodium phosphate ($NaH_2PO_2$), and a N—N-dimethyl glycine sodium.

The second metal is a good conductivity material such as Pd, Pt, Au, Cu, Mo Cr, and Ti.

The thin film transistor for use in the LCD device according to the preferred embodiment of the present invention has the following advantages. First, because the step portion due to the gate electrode does not occur, a line defect such as a line open of the source and drain electrodes is prevented. Secondly, because the gate electrode can be made of copper having a low resistivity, the width of the gate electrode can be decreased, thereby increasing the aperture ratio. Third, because the gate electrode is formed in a groove of the substrate, parasitic capacitance generated at the step portion (step coverage) between the gate electrode and the source and drain electrodes can be reduced, thereby decreasing an RC delay and preventing a flicker.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, method of manufacturing a thin film transistor, comprising preparing a substrate and a mixed solution, the mixed solution having a reductant and a first metal; forming a photoresist pattern on the substrate; etching a portion of the substrate to form a groove using the photoresist pattern as a mask; depositing a second metal on the substrate, a height of the second metal being smaller than a depth of the groove; removing the photoresist pattern on the substrate and the second metal on the photoresist other than in the groove; and forming the first metal on the second metal in the groove by submerging the substrate having the first metal in the mixed solution.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, example of which is illustrated in the accompanying drawings.

Figure 4:
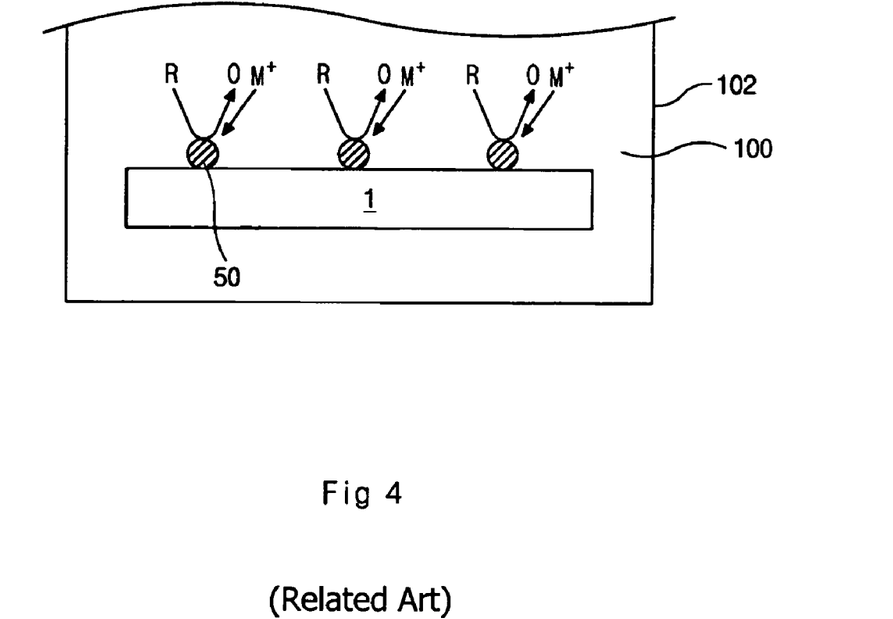
FIG. 4 is a view illustrating a principle of electroless plating according to the preferred embodiment of the present invention.

FIG. 4 shows a principle of the electroless plating according to the preferred embodiment of the present invention. The electroless plating technique does not use electricity, but a chemical reaction (an oxidation-reduction reaction) in a mixed solution and an electrical potential. Preferably, a seed metal is prepared for the electroless plating process. As shown in FIG. 4, a substrate 1 having a seed metal 50 is reacted sufficiently in a vessel 102 including a mixed solution 100. The seed metal 50 having a stable atomic structure is reduced by a reductant R contained in the mixed solution 100, so that it is in the state for receiving a cation. In other words, the seed metal 50 has only an anion that is combined with a cation. A metal M contained in the mixed solution 100 is in a state that such electrons are needed, and thus is combined with the seed metal 50 having electrons. Therefore, the seed metal 50 is plated with the metal M contained in the mixed solution 100. At this time, the metal M and the seed metal 50 become an alloy, and the reduction reaction is continually performed on a surface of the alloy metal, thereby plating the seed metal 50 with the metal M contained in the mixed solution 100.

The method of forming the metal line according to the preferred embodiment of the present invention uses the electroless plating described above. Preferably, the seed metal 50 according to the preferred embodiment of the present invention is one having a good conductivity such as Pd, Pt, Au, Cu, Mo Cr, Ti and the like. The reductant R is preferably is a formaldehyde (HCHO) that is excellent in reduction. The metal M contained in the mixed solution 100 is preferably a low resistive metal such as Ag, Au, Cu and the like. A composition of the mixed solution 100 depends on a kind of the metal M contained therein. The composition of the mixed solution 100 according to a kind of the metal M is as follows.

First, when the metal M is a copper (Cu), the mixed solution 100 contains a sulfuric acid ($H_2SO_4$), a cupric sulfate ($CuSO_4.5H_2O$), and a formaldehyde (HCHO). Therefore, $Cu^{2+}$ contained in a sulfate acid and $OH^-$ group contained in a formaldehyde are used. In other words, $Cu^{2+}$ contained in a sulfuric acid is plated. At this point, a formaldehyde (HCHO) is used as a reductant. Instead of a formaldehyde, a hydrazine, a sodium phosphate ($NaH_2PO_2$), a sodium borate ($NaBH_4$), or a dimethyl amine borane (DMAB) may be used as a reductant.

Second, when the metal M is a silver (Ag), the mixed solution 100 contains a silver nitrate ($AgNO_3$), an ammonium hydroxide ($NH_4OH$), and a sodium hydroxide (NaOH). As a reductant, a formaldehyde, a hydrazine or a grape sugar is used. At this point, $Ag^{2+}$ contained in a silver nitrate ($AgNO_3$) is plated.

Third, when the metal M is a gold (Au), the mixed solution 100 contains a gold chloride ($AuCl_2$), a sodium chloride (NaCl), and a water ($H_2O$). As a reductant, a formaldehyde, a glucose, a sodium phosphate ($NaH_2PO_2$), or a N—N-dimethyl glycine sodium is used. At this point, $Au^{2+}$ contained in a gold chloride ($AuCl_2$) is plated.

As described above, the composition of the mixed solution 100 varies according to a kind of the metal M, and a formaldehyde (HCHO) is usually used as a reductant.

Figure 5A:
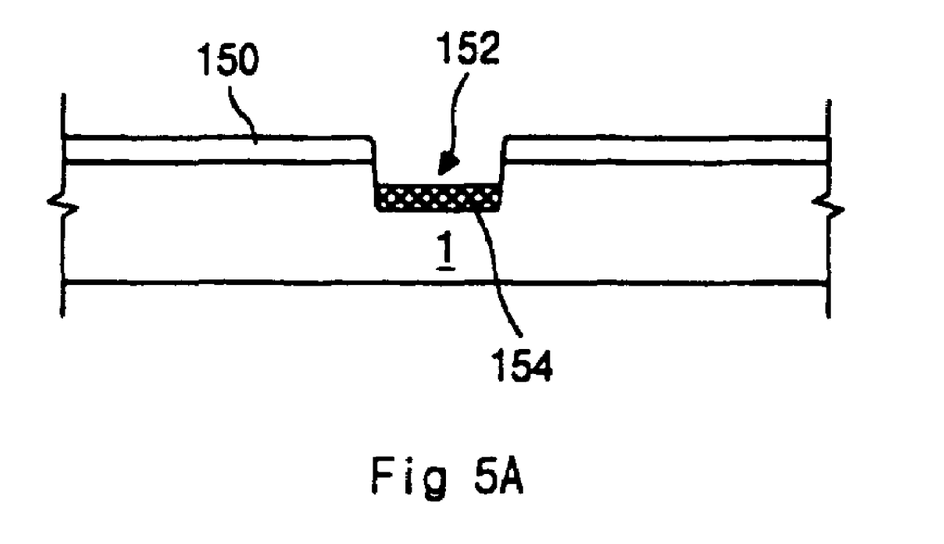
FIGS. 5A to 5B are cross sectional views illustrating a method of forming a metal line using the electroless plating technique according to the preferred embodiment of the present invention.

FIGS. 5A to 5B are cross sectional views illustrating a method of forming a metal line using the electroless plating method. First, as shown in FIG. 5A, a photoresist pattern 150 is formed on a substrate 1 and then the substrate 1 is etched in the form of the pattern to form a groove 152. The seed metal 154 is deposited on the whole surface of the substrate 1. Thereafter, when the seed metal 154 on the photoresist 150 is removed, the seed metal 154 remains only on the groove 152.

Figure 5B:
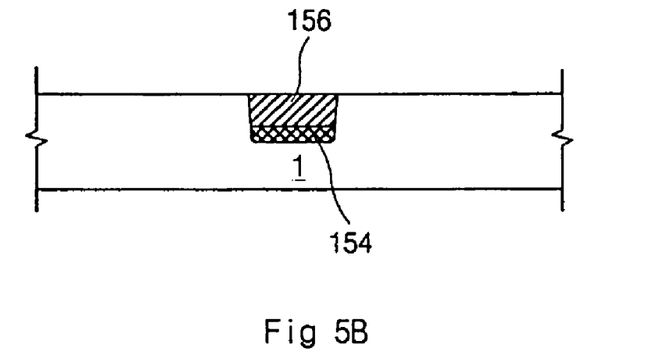

As shown in FIG. 5B, a metal line 156 is formed by the electroless plating technique using the seed metal 154. Preferably, the seed metal 154 includes Pd, Au, or Pt. Also, the seed metal 154 may be made of Cu, Mo, Cr, Ti, Ni, W, or Co. The metal line 156 includes a low resistive metal such as Cu, Ag, and Au.

Figure 6A:
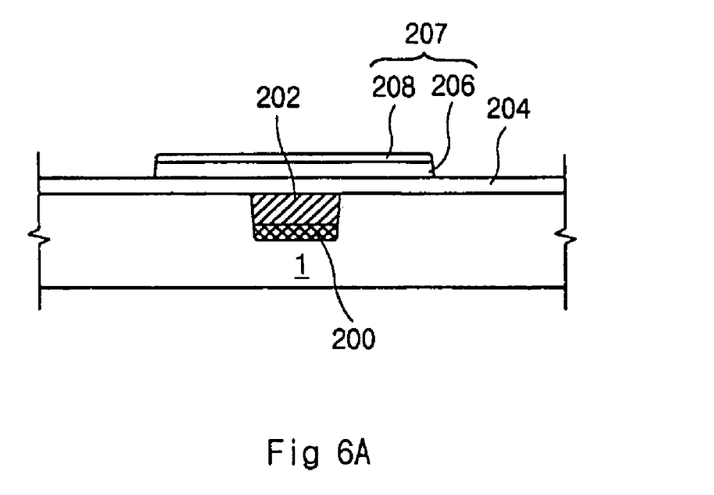
FIGS. 6A to 6D are cross section views illustrating a method of manufacturing a thin film transistor according to the preferred embodiment of the present invention.

A method of manufacturing a thin film transistor using the metal line 156 as a gate electrode is explained with reference to FIGS. 6A to 6D. As shown in FIG. 6A, a gate insulating layer 204, an amorphous silicon layer 206, and a doped amorphous silicon layer 208 are sequentially deposited on the substrate 1 in which the gate electrode 202 is formed. Thereafter, the amorphous silicon layer 206 and the doped amorphous silicon layer 208 are patterned into a semiconductor layer 207. At this point, the seed metal 200 is formed under the gate electrode 202. A mask process is performed two times until the semiconductor layer 207 is formed. In other words, a first mask process is used to etch the substrate 1 so as to form the groove 152, and a second mask process is used to form the semiconductor layer 207.

Figure 6B:
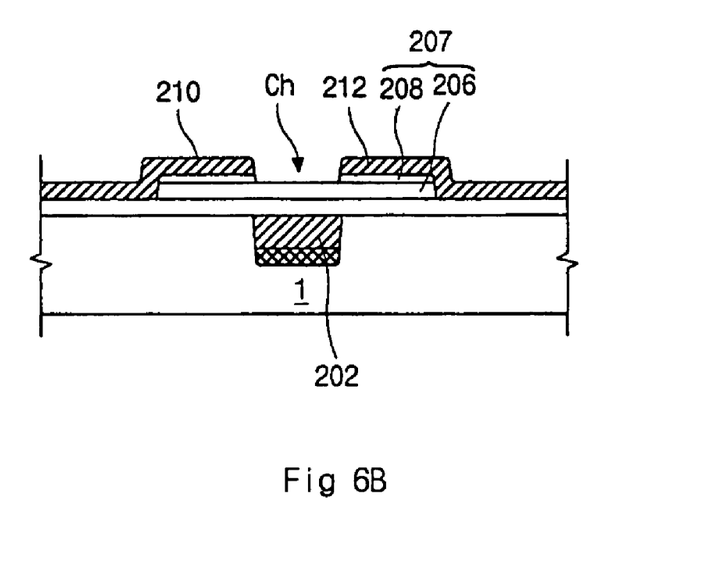

Subsequently, as shown in FIG. 6B, source and drain electrodes 210 and 212 are formed on the semiconductor layer 207. The source and drain electrodes 210 and 212 are spaced apart from each other and overlap both end portions of the semiconductor layer 207. A portion of the doped amorphous silicon layer 208 between the source and drain electrodes 210 and 212 is etched to form a channel region "Ch". In the preferred embodiment of the present invention, because the step portion (step coverage) due to the gate electrode 30 (see FIG. 4) does not occur, a line defect such as a line open of the source and drain electrodes 210 and 212 is prevented.

Figure 6C:
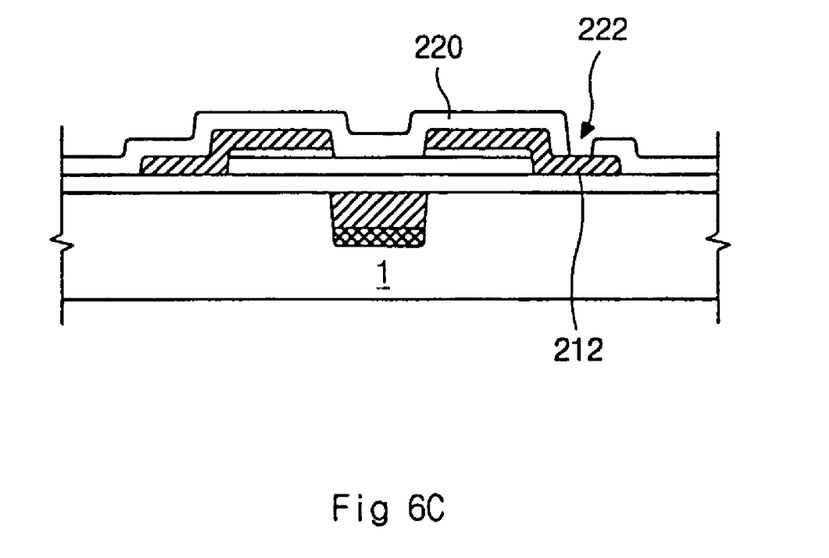

Then, as shown in FIG. 6C, a passivation layer 220 is formed over the whole substrate 1 while covering the source and drain electrodes 210 and 212. The passivation layer 220 includes a contact hole 222 on a portion of the drain electrode 212.

Figure 6D:
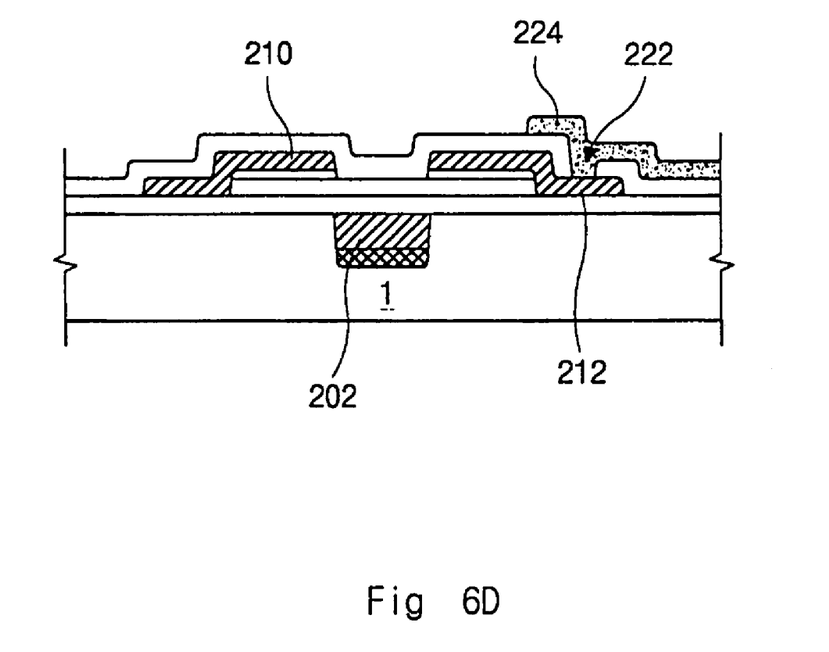

Finally, as shown in FIG. 6D, a pixel electrode 224 is formed on the passivation layer 220. The pixel electrode 224 is electrically connected with the drain electrode 212 through the contact hole 222. Therefore, most of important components of the thin film transistor are completed.

As described herein before, the thin film transistor for use in the LCD device according to the preferred embodiment of the present invention has the following advantages. First, because a step portion due to the gate electrode does not occur, a line defect such as a line open of the source and drain electrodes is prevented. Second, because the gate electrode a can be made of copper having a low resistivity, the width of the gate electrode can be decreased, thereby increasing the aperture ratio. Third, since the gate electrode is formed in a groove of the substrate, parasitic capacitance generated at the step portion between the gate electrode and the source and drain electrodes can be reduced, thereby decreasing an RC delay and preventing a flicker.

It will be apparent to those skilled in the art that various modifications and variation can be made in the method of manufacturing a thin film transistor of the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor for use in an LCD device, comprising:
preparing a substrate and a mixed solution, the mixed solution having a reductant and a first metal;
forming a photoresist pattern on the substrate;
etching a portion of the substrate to form a groove beneath a top surface of the substrate using the photoresist pattern as a mask;
depositing a second metal on the substrate, a height of the second metal being smaller than a depth of the groove;
removing the photoresist pattern on the substrate and the second metal on the photoresist other than in the groove; and
forming the first metal on the second metal in the groove by submerging the substrate in the mixed solution
wherein the first metal on the second metal is at substantially the same height as the substrate, and wherein a surface including the surface of the substrate and the surface of the first metal is substantially planar.

2. The method of claim 1, wherein the first metal is a copper (Cu).

3. The method of claim 2, wherein the mixed solution includes a sulfuric acid ($H_2SO_4$) and a cupric sulfate ($CuSO_4.5H_2O$).

4. The method of claim 3, wherein the reductant is one of a formaldehyde (HCHO), a hydrazine, a sodium phosphate ($NaH_2PO_2$), a sodium borate ($NaBH_4$), and a dimethyl amine borane (DMAB).

5. The method of claim 1, wherein the first metal is a silver (Ag).

6. The method of claim 5, wherein the mixed solution includes a silver nitrate ($AgNO_3$), an ammonium hydroxide ($NH_4OH$), and a sodium hydroxide (NaOH).

7. The method of claim 6, wherein the reductant is one of a formaldehyde, a hydrazine and a glucose.

8. The method of claim 1, wherein the first metal is a gold (Au).

9. The method of claim 8, wherein the mixed solution includes a gold chloride ($AuCl_2$), a sodium chloride (NaCl), and water ($H_2O$).

10. The method of claim 9, wherein the reductant is one of a formaldehyde, a glucose, a sodium phosphate ($NaH_2PO_2$), and a N—N-dimethyl glycine sodium.

11. The method of claim 1, wherein the second metal is one of Pd, Pt, Au, Cu, Mo, Cr, Ti, Ni, W and Co.

12. The method of claim 1, further comprising:

forming a first insulating layer over the substrate to cover the first metal;

forming a semiconductor layer on the first insulating layer;

forming source and drain electrodes on the semiconductor layer;

forming a second insulating layer over the whole substrate covering the source and drain electrode, the second insulating layer including a contact hole on a portion of the drain electrode; and forming a pixel electrode on the second insulating layer, the pixel electrode electrically connecting with the drain electrode through the contact hole.

13. The method of claim 12, wherein the first metal is a gate electrode.

* * * * *